(12) United States Patent
Egusa

(10) Patent No.: US 7,470,981 B2
(45) Date of Patent: Dec. 30, 2008

(54) SEMICONDUCTOR DEVICE WITH VARYING DUMMY VIA-HOLE PLUG DENSITY

(75) Inventor: Kazuhiko Egusa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 441 days.

(21) Appl. No.: 11/235,548

(22) Filed: Sep. 27, 2005

(65) Prior Publication Data

US 2006/0065981 A1    Mar. 30, 2006

(30) Foreign Application Priority Data

Sep. 29, 2004  (JP)  ............................ 2004-284938

(51) Int. Cl.
*H01L 23/12* (2006.01)
(52) U.S. Cl. .................. 257/700; 257/758; 257/774; 257/E23.011; 257/E23.067; 257/E21.577
(58) Field of Classification Search .................. None
See application file for complete search history.

(56) References Cited

U.S. PATENT DOCUMENTS

| | | | | |
|---|---|---|---|---|
| 6,313,497 | B1 * | 11/2001 | Iwasa .......................... | 257/306 |
| 6,342,734 | B1 * | 1/2002 | Allman et al. ............... | 257/758 |
| 6,541,335 | B2 * | 4/2003 | Iwasa .......................... | 438/243 |
| 6,657,247 | B2 * | 12/2003 | Yoshiyama et al. ......... | 257/303 |
| 6,998,663 | B2 * | 2/2006 | Yoshitomi et al. ........... | 257/296 |

FOREIGN PATENT DOCUMENTS

| | | | |
|---|---|---|---|
| JP | 8-222632 A | 8/1996 |
| KR | 1999-0075978 A | 10/1999 |
| KR | 2000-0019031 A | 4/2000 |

* cited by examiner

*Primary Examiner*—Alonzo Chambliss
(74) *Attorney, Agent, or Firm*—Nixon & Vanderhye P.C.

(57) ABSTRACT

The present invention is concerned with a method for producing a semiconductor device wherein lower-layer wirings and upper-layer wirings are formed with an interlayer insulating film therebetween, and the lower-layer wirings are electrically connected to the upper-layer wirings via via-hole plugs. Over a semiconductor substrate, the interlayer insulating film is formed to cover the lower-layer wirings. In the interlayer insulating film, via-holes for exposing surfaces of the lower-layer wirings are formed, and simultaneously, in a region of the interlayer insulating film where no via-holes exist, dummy via-holes which are not deep enough to reach down to the lower-layer wirings are formed. The dummy via-holes are formed in such a manner that the density of the dummy via-holes gradually decreases from a region where the via-holes are formed. Over the semiconductor substrate, a metal layer is formed to fill the via-holes and the dummy via-holes. A portion over the semiconductor substrate is polished thereby forming the via-hole plugs and dummy via-hole plugs. The upper-layer wirings are formed in such a manner that the upper-layer wirings come in contact with the via-hole plugs. According to this method, a semiconductor device that has high flatness of the interlayer insulating film is obtained.

3 Claims, 5 Drawing Sheets

(A)
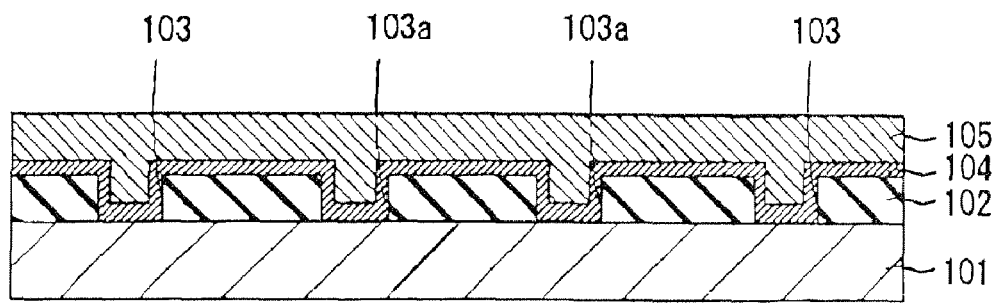
↓ CMP
(B)
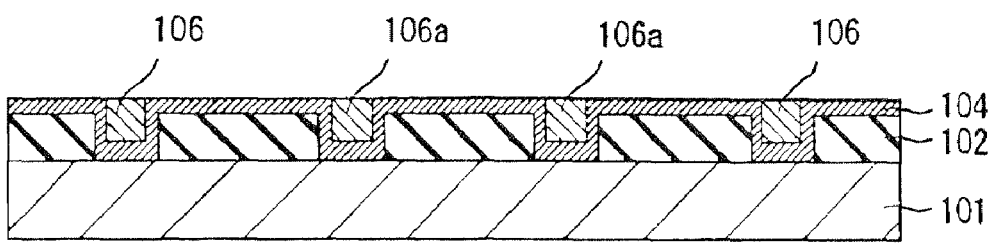
Fig.5
(Prior Art)

SEMICONDUCTOR DEVICE WITH VARYING DUMMY VIA-HOLE PLUG DENSITY

This non-provisional application claims priority under 35 U.S.C. §119(a) on Japanese Patent Application No. 2004-284938 filed in Japan on Sep. 29, 2004, the entire contents of which are hereby incorporated by reference.

BACKGROUND

1) Field of the Invention

The technology presented herein generally relates to semiconductor devices, and more particularly to a semiconductor device that has high flatness of the interlayer insulating film. The technology also relates to a method for producing the semiconductor device.

2) Description of the Related Art

With high integration and large capacitance of integrated circuit elements, the wirings on semiconductor devices are becoming miniaturized, and thus there is a need for a method for forming wirings and plugs between wirings with higher flatness. A widely used method in view of the need is such that after forming a via-hole, metal such as tungsten accumulates and is filled in the via-hole, and by removing the metal over the interlayer insulating film by chemical mechanical polishing (hereinafter referred to as CMP), a via-hole plug is formed.

FIG. 3 is a cross-section showing an example of a conventional method for forming a via-hole plug by CMP. Referring to FIG. 3(A), insulating film 2 is formed on semiconductor substrate 1. On insulating film 2, lower-layer wiring 3 is formed. Interlayer insulating film 4 is formed to cover lower-layer wiring 3, and in interlayer insulating film 4, by using photolithography and etching, via-hole 6a that exposes the surface of lower-layer wiring 3 is formed. By the chemical vapor deposition (CVD) method, conductive film 8 of, for example, a tungsten film accumulates over the entire surface to fill via-hole 6a. There is a case where for improvement of adhesion, a titanium nitride film or the like accumulates prior to accumulation of conductive film 8 to have a plurality of conductive-film structures.

Subsequently referring to FIGS. 3(A) and 3(B), by removing conductive film 8 over interlayer insulating film 4 by CMP, via-hole plug 8a is formed with high flatness.

However, the above-described CMP, used when forming via-hole plugs between wirings, is problematic in that CMP is affected by the roughness and fineness of arranged via-hole plugs, causing variation in the polishing rate of conductive film 8. This will be described below.

FIG. 4 is a view showing the problem of CMP encountered when there is roughness and fineness of arrangement of via-holes, that is, when there are region H where via-holes are densely formed and region L where no via-holes exist.

Referring to FIG. 4(A), insulating film 2 is formed on semiconductor substrate 1. On insulating film 2, lower-layer wirings 3 are formed. Interlayer insulating film 4 is formed to cover lower-layer wirings 3, and in interlayer insulating film 4, by using photolithography and etching, via-holes 6a that expose the surfaces of lower-layer wirings 3 are formed. In this example, region H where via-holes 6a exist densely and region L where no via-holes exist will be described.

Referring to FIG. 4(B), by the chemical vapor deposition (CVD) method, conductive film 8 of, for example, a tungsten film accumulates over the entire surface to fill via-holes 6a. There is a case where for improvement of adhesion, titanium nitride film 9 or the like accumulates prior to accumulation of conductive film 8 to have a plurality of conductive-film structures. Subsequently, referring to FIGS. 4(B) and 4(C), by removing conductive film 8 and titanium nitride film 9 over interlayer insulating film 4 by CMP, via-hole plugs 8a are formed.

In this case, referring to FIG. 4(C), a phenomenon called erosion occurs, and fang form 12 is locally observed. Erosion means that a portion of the insulating film that is not supposed to be polished is polished by CMP, a phenomenon typically seen in dense wirings and wide wirings.

Because of the erosion phenomenon, in region L, where no via-hole plugs are provided, in comparison with region H, where via-hole plugs 8a are provided, the polishing rate of conductive film 8 is significantly reduced, making the difference between the polishing rates even larger. Because of the erosion phenomenon, after forming via-hole plugs 8a, trouble that the flatness of interlayer insulating film 4 is impaired is caused. In the figure, reference numeral 11 indicates the amount of depression because of the erosion phenomenon. In addition, around the interface portion between region L, where no via-hole plugs 8a are provided, and region H, where via-hole plugs 8a are provided, large fang form 12 is locally observed, and also the flatness of interlayer insulating film 4 is greatly impaired. In the figure, reference numeral 13 indicates the amount of fang.

To obtain flatness of interlayer insulating film 4 at the interface portion between region L, where no via-hole plugs are provided, and region H, where via-hole plugs 8a are provided, it is effective to provide a dummy via-hole.

FIG. 5(A) is a cross section of a conventional semiconductor device in which, in view of the above point, dummy via-holes 103a are formed in the interface portion between the region where no via-hole plugs are provided and the region where via-hole plugs are provided (see, for example, Japanese Patent Application Publication No. 8-222632). In the figure, reference numeral 101 indicates a lower-layer wiring, 102 indicates an interlayer insulating film, 103 indicates a via-hole, 104 indicates an adhesive layer, 105 indicates a conductive film, 106 indicates a via-hole plug, and 106a indicates a dummy via-hole plug.

Referring to FIG. 5(B), according to this method, at the time of forming via-hole plugs 106 by CMP, since dummy via-hole plugs 106a are provided in a rough region where there is a wide interval between via-hole plugs, there is no depression caused by over-polishing.

However, with the method described in FIG. 5, when there are regions with various via-hole plug densities, it is difficult to provide dummy via-hole plugs with uniform density, and consequently, it is difficult to eliminate depression caused by over-polishing. In addition, with this method, it is impossible to effectively remove a fang form encountered in the interface portion between the region where no via-hole plugs are provided and the region where via-hole plugs are provided, resulting in the problem that in the end portion of a region with a particularly high via-hole plug density, the surface of the interlayer insulating film cannot be made flat. If a flat surface cannot be obtained for the interlayer insulating film, the processing accuracy of an upper-layer wiring pattern and the reliability of patterning are reduced.

SUMMARY

In view of the foregoing and other problems, it is a feature of an example embodiment presented herein to provide an improved method for producing a semiconductor device so as to obtain a flat surface for the interlayer insulating film even when there are regions with various via-hole plug densities.

It is another feature of the present invention an example embodiment presented herein to provide a method for producing a semiconductor device adapted to reduce the fang form resulting from CMP.

It is another feature of the present invention an example embodiment presented herein to provide an improved method for producing a semiconductor device to realize, in the CMP step for forming the via-hole plug, highly accurate polishing.

It is another feature of an example embodiment presented herein to provide a semiconductor device that has such a flat surface of the interlayer insulating film.

A semiconductor device according an example embodiment comprises a structure such that in a chip of a semiconductor substrate, lower-layer wirings and upper-layer wirings are formed with an interlayer insulating film therebetween, the lower-layer wirings being electrically connected to the upper-layer wirings via via-hole plugs. In a region of the interlayer insulating film where no via-hole plugs exist in contrast to the via-hole plugs connecting the lower-layer wirings to the upper-layer wirings, dummy via-hole plugs are provided, each of the dummy via-hole plugs not being deep enough to reach down to the lower-layer wirings, the density of the dummy via-hole plugs gradually decreasing from a region where the via-hole plugs are provided.

According to the example embodiment, in a region of the interlayer insulating film where no via-hole plugs exist in contrast to the via-hole plugs connecting the lower-layer wirings to the upper-layer wirings, dummy via-hole plugs are provided which are not deep enough to reach down to the lower-layer wirings, and the density of the dummy via-hole plugs gradually decreases from the region where the via-hole plugs are provided. Because of this structure, when forming the via-hole plugs by CMP, chemical mechanical polishing is carried out uniformly in the interface portion between the region where no via-hole plugs are provided and the region where via-hole plugs are provided. In addition, since the dummy via-hole plugs are not deep enough to reach down to the lower-layer wirings, the dummy via-hole plugs do not provide electrical conduction between the upper-layer wirings and the lower-layer wirings.

In a preferred embodiment, the opening portion area of each of the dummy via-hole plugs is from 25% to 75% of the opening portion area of each of the via-hole plugs.

In a preferred embodiment, the density of the dummy via-hole plugs in the region where no via-hole plugs exist is from 1% to 15%.

A method according to another aspect of the example embodiment presented herein is concerned with a method for producing a semiconductor device wherein lower-layer wirings and upper-layer wirings are formed with an interlayer insulating film therebetween, and the lower-layer wirings are electrically connected to the upper-layer wirings via via-hole plugs. First, over a semiconductor substrate, the interlayer insulating film is formed to cover the lower-layer wirings. In the interlayer insulating film, via-holes for exposing surfaces of the lower-layer wirings are formed, and simultaneously, in a region of the interlayer insulating film where no via-holes exist, dummy via-holes each not being deep enough to reach down to the lower-layer wirings are formed. The dummy via-holes are formed in such a manner that the density of the dummy via-holes gradually decreases from a region where the via-holes are formed. Over the semiconductor substrate, a metal layer to fill the via-holes and the dummy via-holes is formed. A portion over the semiconductor substrate is polished thereby forming the via-hole plugs and dummy via-hole plugs. The upper-layer wirings are formed in such a manner that the upper-layer wirings come in contact with the via-hole plugs.

According to an example embodiment, in a region of the interlayer insulating film where no via-holes exist, dummy via-holes are formed which are not deep enough to reach down to the lower-layer wirings, in such a manner that the density of the dummy via-holes gradually decreases from a region where the via-holes are formed. Because of this structure, when forming the via-hole plugs by CMP, chemical mechanical polishing is carried out uniformly in the interface portion between the region where no via-hole plugs are formed and the region where via-hole plugs are formed.

In a preferred embodiment, the opening portion area of each of the dummy via-hole plugs is from 25% to 75% of the opening portion area of each of the via-hole plugs.

As the diameter of the opening of the hole decreases, because of what is called the micro-loading phenomenon, the depth of etching becomes shallower, and thus a dummy via-hole that is not deep enough to reach down to the lower-layer wiring is obtained.

In a preferred embodiment, the dummy via-hole plugs are formed in the region where no via-hole plugs exist in such a manner that the density of the dummy via-hole plugs is from 1% to 15%.

By forming the dummy via-holes in such a manner that the density of the dummy via-holes gradually decreases ultimately down to 1% as the dummy via-holes are formed away from the region where the via-holes are formed, the fang form resulting from CMP is reduced.

According to an example embodiment, in a region of the interlayer insulating film where no via-hole plugs exist in contrast to the via-hole plugs connecting the lower-layer wirings to the upper-layer wirings, dummy via-hole plugs are provided which are not deep enough to reach down to the lower-layer wirings, and the density of the dummy via-hole plugs gradually decreases from the region where the via-hole plugs are provided. Because of this structure, when forming the via-hole plugs by CMP, the chemical mechanical polishing is carried out uniformly in the interface portion between the region where no via-hole plugs are provided and the region where via-hole plugs are provided. In addition, by forming the dummy via-holes in the region where no via-holes exist in such a manner that the density of the dummy via-holes is from 1% to 15%, and thus the density of the dummy via-hole plugs gradually decreases from the region where the via-hole plugs are formed, the fang form resulting from CMP is reduced. As a result, such a via-hole plug is formed that realizes, in the CMP step of the via-hole-plug formation process, highly accurate polishing and has high flatness.

BRIEF DESCRIPTION OF THE DRAWINGS

FIG. 5(A)-FIG. 5(B) are views showing steps of another conventional method for producing a semiconductor device.

DESCRIPTION OF THE PREFERRED EMBODIMENTS

Figure 1:
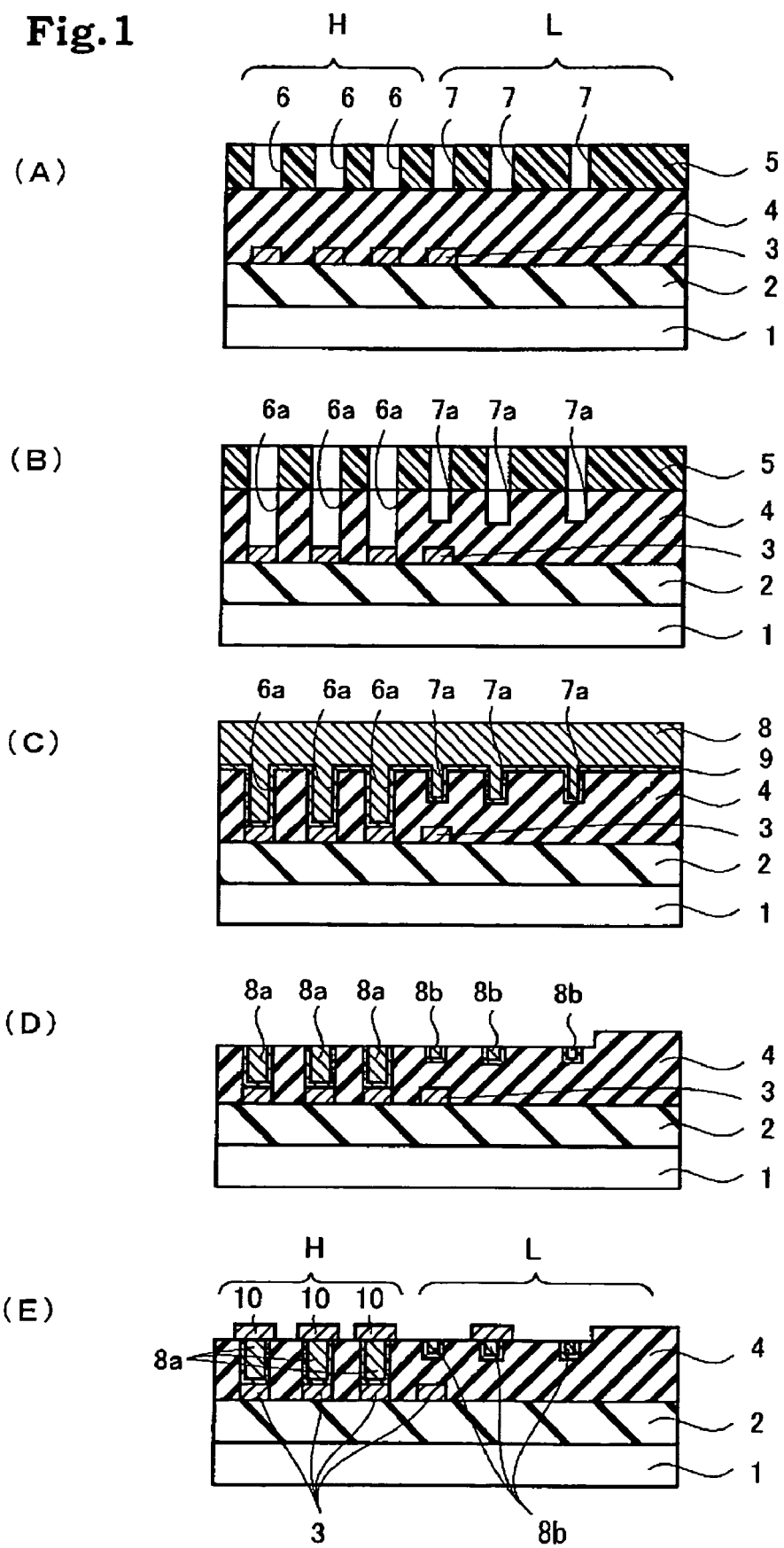
FIG. 1(A)-FIG. 1(E) are views showing steps of the method for producing a semiconductor device according to an embodiment.

The object of obtaining a semiconductor device that has a flat surface of the interlayer insulating film has been realized by the structure that in a region of the interlayer insulating film where no via-holes exist, dummy via-holes are formed which are not deep enough to reach down to the lower-layer wirings, in such a manner that the density of the dummy via-holes gradually decreases from the region where the via-holes are formed, and by using chemical mechanical polishing, the surface of the interlayer insulating film is polished. An embodiment will be described referring to the drawings.

It should be noted that while the embodiment below takes as an example the via-hole plug for connecting the lower-layer wiring to the upper-layer wiring, an identical procedure can be applied to what is called a contact hole, which is for connecting a device element over the semiconductor substrate to the lowermost-layer wiring.

FIG. 1 is a cross-section showing the embodiment in order of production steps. First, referring to FIG. 1(A), lower-layer wirings 3 are formed on insulating layer 2, which is formed on semiconductor substrate 1. On lower-layer wirings 3, interlayer insulating film 4 is formed and then flattened by CMP for required flatness. On interlayer insulating film 4, photo resist 5 is formed. Subsequently, by the photolithography technique, a pattern of via-hole opening portions is formed to photo resist 5. On this occasion, connection-purpose via-hole opening portions 6 that reach lower-layer wirings 3, and dummy via-hole opening portions 7 that do not reach lower-layer wirings 3 are formed. The opening portion area of each of dummy via-hole opening portions 7 is from 25% to 75% of the opening portion area of each of via-hole opening portions 6. This will be described in greater detail later.

The density of dummy via-hole opening portions 7 gradually decreases from region H where the via-holes are formed.

Figure 2:
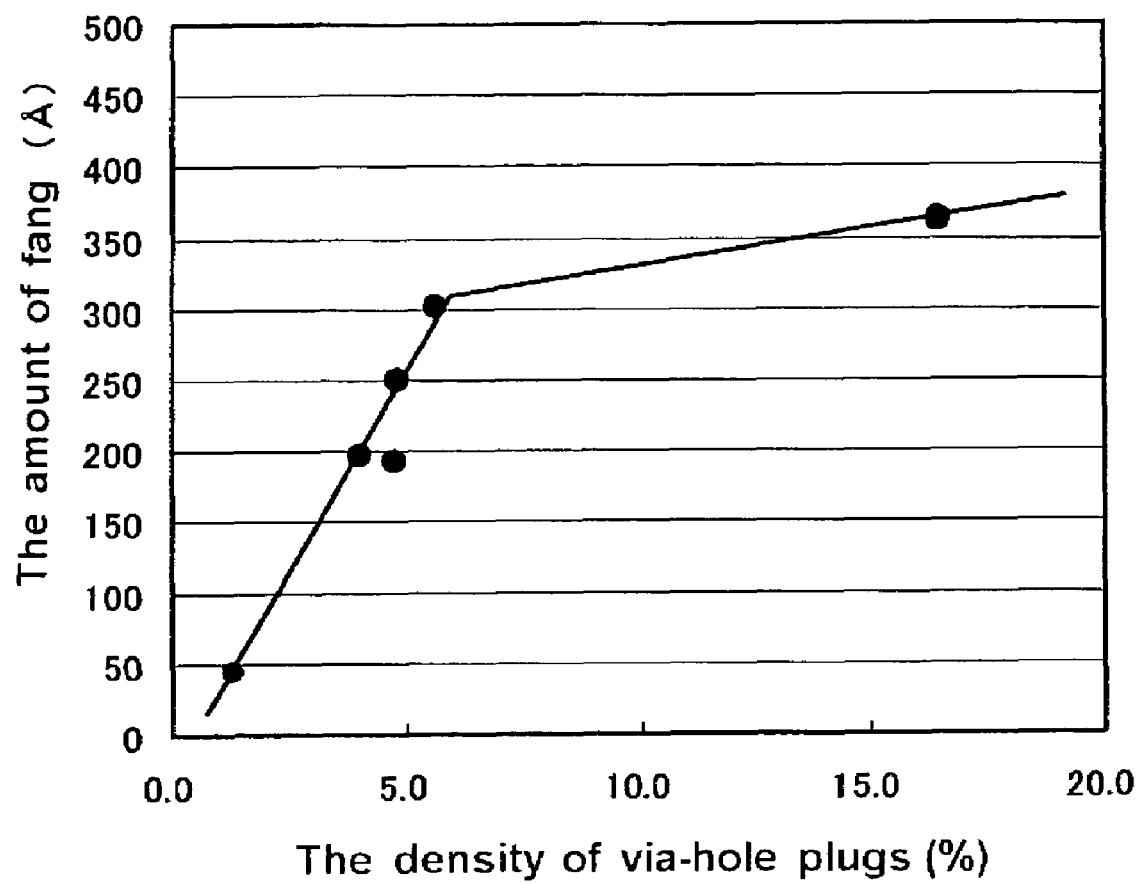
FIG. 2 is a graph showing the relationship between the density of via-hole plugs and the amount of fang.
Figure 3:
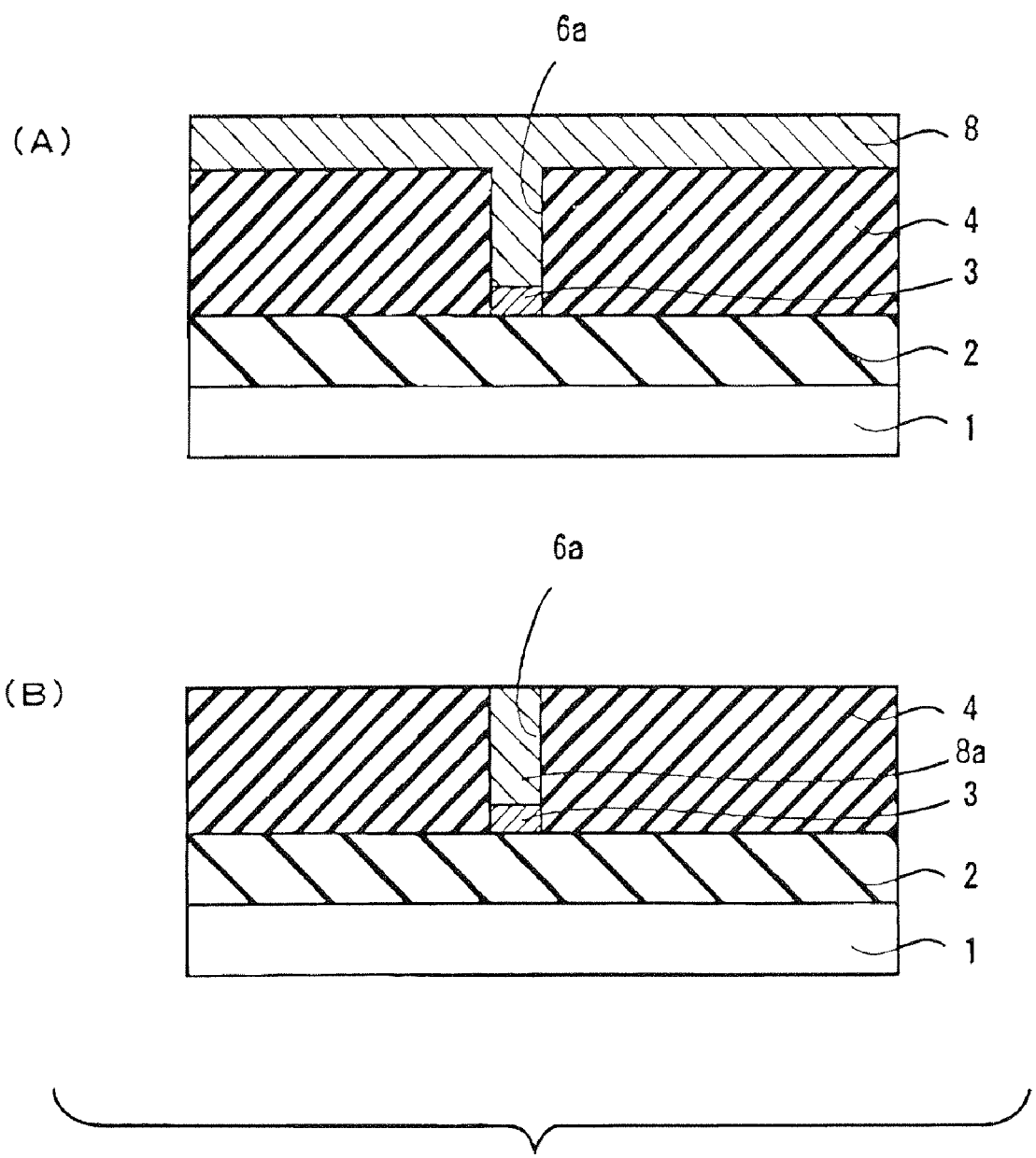
FIG. 3(A)-FIG. 3(B) are views showing steps of a conventional method for producing a semiconductor device.
Figure 4:
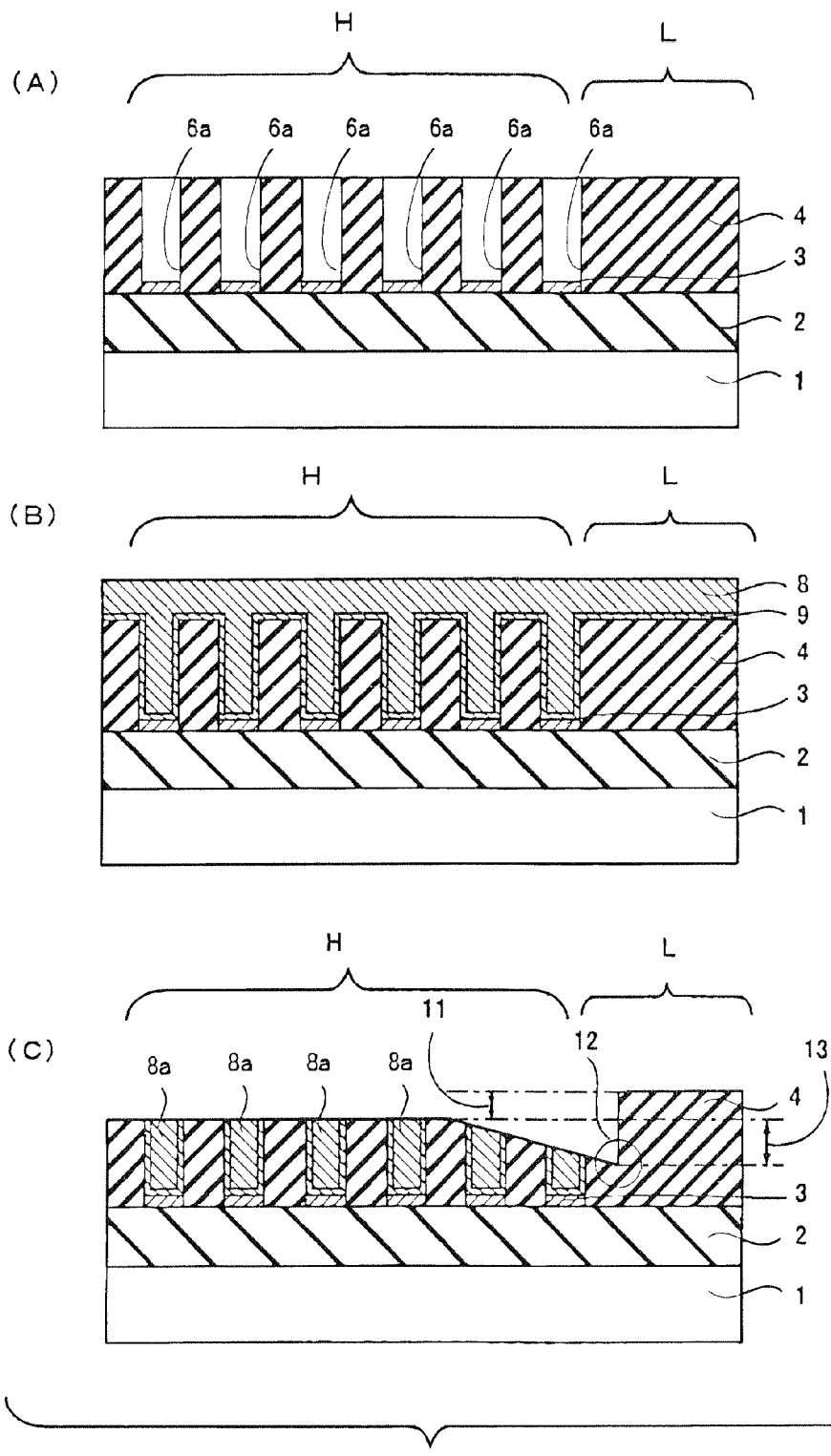
FIG. 4(A)-FIG. 4(C) are views showing steps of another conventional method for producing a semiconductor device.

FIG. 2 shows an example of the relationship between the via-hole-plug density in region H, where the via-hole plugs are provided, and the amount of fang (see reference numeral 13 shown in FIG. 4(C)) resulting from tungsten CMP. It can be seen that as the density of the via-hole plugs decreases, so the amount of fang decreases. Thus, the density of dummy via-hole opening portions 7 to be formed is made to decrease in a gradation manner ultimately down to 1% (the amount of fang is approximately 5 nm) as dummy via-hole opening portions 7 go away from region H, where connection-purpose via-hole opening portions 6 are formed. By having such a pattern of arrangement of dummy via-hole opening portions 7, the fang form resulting from CMP are reduced. Nevertheless, referring to FIG. 2, an ultimate density of from 1% to 5% (the amount of fang is approximately 30 nm) or from 1% to 15% (the amount of fang is approximately 36 nm) is also applicable in practice.

Subsequently, referring to FIG. 1(B), by the hole etching technique, connection-purpose via-holes 6a that reach lower-layer wirings 3 and dummy via-holes 7a that are shallower than the thickness of interlayer insulating film 4 and thus do not reach lower-layer wirings 3 are formed. Generally, in reactive ion etching used for hole etching, as the diameter of the opening of the hole decreases, because of what is called the micro-loading phenomenon, the depth of etching tends to become shallower. Thus, by setting the opening diameter of each of dummy via-hole opening portions 7 to be etched shallower than the thickness of interlayer insulating film 4, dummy via-holes 7a that are shallower than the thickness of interlayer insulating film 4 and thus do not reach lower-layer wirings 3 are formed, simultaneously with the formation of connection-purpose via-holes 6a, which reach lower-layer wirings 3. Next, resist 5 is removed.

Referring to FIG. 1(C), by the CVD method, to fill connection-purpose via-holes 6a and dummy via-holes 7a, conductive film 8 of, for example, a tungsten film accumulates over the entire surface. There is a case in which for improvement of adhesion, one or plurality of barrier metal film 9 such as a titanium nitride film accumulates prior to accumulation of conductive film 8 in order to together make up a plurality of conductive-film structures.

Referring to FIG. 1(D), by polishing and removing conductive film 8 and barrier metal film 9, which are over interlayer insulating film 4, by CMP, connection-purpose via-hole plugs 8a and dummy via-hole plugs 8b are formed. In this CMP step, in region L of interlayer insulating film 4 where no connection-purpose via-hole plugs 8a exist, such a pattern of dummy via-hole plugs 8b is provided that the density of dummy via-hole plugs 8b decreases in a gradation manner as dummy via-hole plugs 8b go away from region H, where connection-purpose via-hole plugs 8a are formed. This reduces the fang form resulting from CMP and enables it to obtain higher flatness of interlayer insulating film 4 after completion of polishing.

Referring to FIG. 1(E), dummy via-hole plugs 8b, which are formed simultaneously with connection-purpose via-hole plugs 8a, are not deep enough to reach down to lower-layer wirings 3, and therefore do not provide conduction between upper-layer wirings 10 and lower-layer wirings 3. Since dummy via-hole plugs 8b do not provide conduction, they are not affected by the location of upper-layer wirings 10 and lower-layer wirings 3 and can be arranged arbitrarily.

While this embodiment has taken as an example the via-hole plug for connecting the lower-layer wiring and the upper-layer wiring, the example embodiment presented herein is not limited to this. The example embodiment can be applied to what is called a contact hole, which is for connecting a device element over the semiconductor substrate to the lowermost-layer wiring.

The embodiment herein described is to be considered in all respects as illustrative and not restrictive. The scope of the embodiment should be determined not by the Embodiments illustrated, but by the appended claims, and all changes which come within the meaning and range of equivalency of the appended claims are therefore intended to be embraced therein.

The example embodiment presented herein enables formation of wirings and plugs between wirings that have higher flatness, and therefore allows for high integration and large capacitance of integrated circuit elements.

What is claimed is:

1. A semiconductor device comprising, lower-layer wirings and upper-layer wirings are formed with an interlayer insulating film therebetween on a semiconductor substrate, the lower-layer wirings being eletrically connected to the upper-layer wirings via via-hole plugs, wherein
    in a region of the interlayer insulating film where no via-hole plugs exist for connecting the lower-layer wirings to the upper-layer wirings, dummy conductive via-hole plugs are provided, each of the dummy via-hole plugs not being deep enough to reach down to the lower-layer wirings, wherein
    each of said dummy conductive via-hole plugs does not provide electrical connection between any pair of writing, and
    the density of the dummy conductive via-hole plugs gradually decreases from a region where the via-hole plugs are provided.

2. The semiconductor device according to claim 1, wherein an opening portion area of each of the dummy conductive via-hole plugs is from 25% to 75% of an opening portion area of each of the via-hole plugs.

3. The semiconductor device according to claim 1, wherein the density of the dummy conductive via-hole plugs in the region where no via-hole plugs exist is from 1% to 15%, wherein the density is defined as the ratio of the sum of the opening portion areas of the dummy conductive via-hole plugs over the area of the region where no via-hole plugs exist.

* * * * *